United States Patent
Zang et al.

(10) Patent No.: US 10,090,169 B1
(45) Date of Patent: Oct. 2, 2018

(54) METHODS OF FORMING INTEGRATED CIRCUIT STRUCTURES INCLUDING OPENING FILLED WITH INSULATOR IN METAL GATE

(71) Applicant: GLOBALFOUNDRIES INC., Grand Cayman (KY)

(72) Inventors: Hui Zang, Guilderland, NY (US); Haigou Huang, Rexford, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 22 days.

(21) Appl. No.: 15/475,272

(22) Filed: Mar. 31, 2017

(51) Int. Cl.
| | |
|---|---|
| H01L 21/3205 | (2006.01) |
| H01L 29/66 | (2006.01) |
| H01L 21/28 | (2006.01) |
| H01L 21/02 | (2006.01) |
| H01L 21/321 | (2006.01) |
| H01L 29/49 | (2006.01) |
| H01L 21/3105 | (2006.01) |

(52) U.S. Cl.
CPC ...... H01L 21/3205 (2013.01); H01L 21/0217 (2013.01); H01L 21/0228 (2013.01); H01L 21/02274 (2013.01); H01L 21/02362 (2013.01); H01L 21/28079 (2013.01); H01L 21/28088 (2013.01); H01L 21/31053 (2013.01); H01L 21/32115 (2013.01); H01L 29/495 (2013.01); H01L 29/4966 (2013.01); H01L 29/66545 (2013.01)

(58) Field of Classification Search
None
See application file for complete search history.

(56) References Cited

U.S. PATENT DOCUMENTS

| | | | |
|---|---|---|---|
| 6,027,961 A * | 2/2000 | Maiti | H01L 21/823842 257/E21.637 |
| 8,334,184 B2 | 12/2012 | Steigerwald et al. | |
| 9,064,932 B1 | 6/2015 | Pham et al. | |
| 9,245,885 B1 * | 1/2016 | Xie | H01L 27/0886 |
| 9,520,482 B1 | 12/2016 | Chang et al. | |
| 2016/0027901 A1 * | 1/2016 | Park | H01L 29/4983 257/288 |

* cited by examiner

Primary Examiner — Eva Y Montalvo
Assistant Examiner — Kevin Quinto
(74) Attorney, Agent, or Firm — Francois Pagette; Hoffman Warnick LLC

(57) ABSTRACT

The disclosure is directed to methods of forming an integrated circuit structure. One method may include: forming a metal gate within a dielectric layer over a substrate; forming an opening within the metal gate; recessing the metal gate such that a height of the metal gate is reduced; forming an insulator over the recessed metal gate and filling the opening; and planarizing the insulator to a top surface of the dielectric layer.

19 Claims, 16 Drawing Sheets

METHODS OF FORMING INTEGRATED CIRCUIT STRUCTURES INCLUDING OPENING FILLED WITH INSULATOR IN METAL GATE

BACKGROUND

Technical Field

The present disclosure relates to integrated circuit structures, or more particularly, to methods of forming integrated circuit structures including an opening filled with an insulator within a metal gate.

Related Art

In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A FET, irrespective of whether an NMOS transistor or a PMOS transistor is considered, and irrespective of whether it is a planar or 3D FinFET device, typically comprises doped source and drain regions that are formed in a semiconducting substrate that are separated by a channel region. A gate dielectric layer is positioned above the channel region and a conductive gate electrode is positioned above the gate dielectric layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device.

In general, one commonly employed technique for forming gate structures for either planar or 3D devices involves forming a line-type gate electrode structure above the gate dielectric layer that is formed above an active region defined in a semiconductor substrate. As may be desired, the gate structures may be "cut" such that an opening may be formed therein. The opening may be filled with an insulator thereby isolating portions of the gate structures. As IC structures continue to decrease in size, methods of forming structure therein are difficult and costly to form. For example, conventional methods for forming the insulator within the gate structures require multiple depositions and planarizing of the insulator which is both timely and costly.

SUMMARY

A first aspect of the disclosure is directed to a method of forming an integrated circuit structure. The method may include: forming a metal gate within a dielectric layer over a substrate; forming an opening within the metal gate; recessing the metal gate such that a height of the metal gate is reduced; forming an insulator over the recessed metal gate and filling the opening; and planarizing the insulator to a top surface of the dielectric layer.

A second aspect of the disclosure is directed to a method. The method may include: removing a dummy gate from between a pair of spacers over a substrate within a dielectric layer; forming a replacement metal gate between the pair of spacers over the substrate; forming an opening within the replacement metal gate thereby exposing the substrate thereunder; recessing the replacement metal gate such that a height of the replacement metal gate is reduced; forming an insulator over the recessed replacement metal gate and filling the opening; and planarizing the insulator top a top surface of the dielectric layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit structures, or more particularly, to methods of forming integrated circuit structures including an opening filled with an insulator within a metal gate. In contrast to conventional methods of forming an insulator within a metal gate, the present disclosure provides methods for simultaneously forming and planarizing an insulator within a metal gate in addition over the metal gate thereby forming a cap layer over the metal gate.

Figure 1:
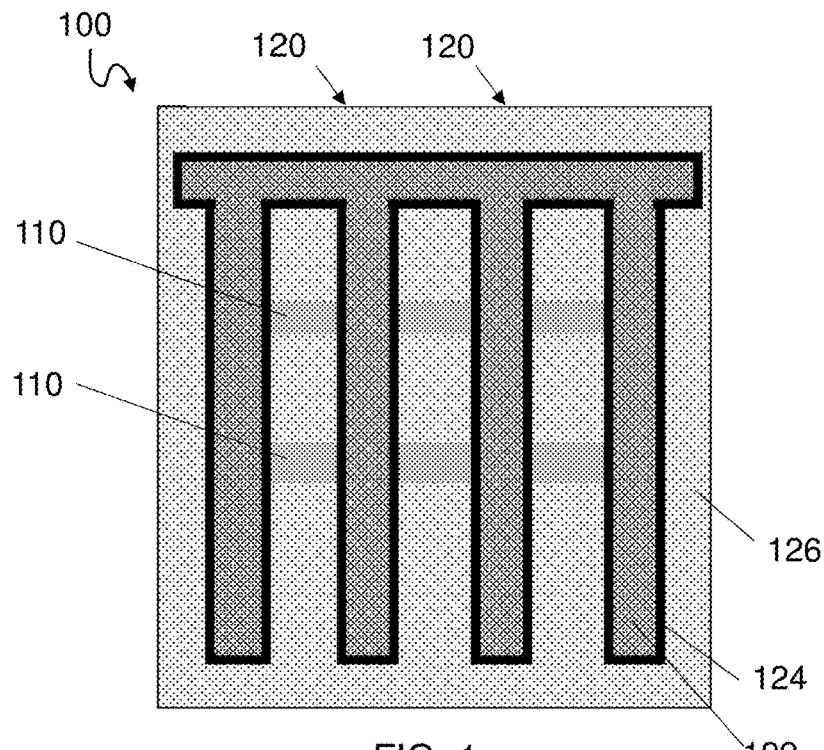
FIGS. 1-3 show top-down views of a preliminary integrated circuit structure.

Referring now to FIG. 1, a top down view of a preliminary integrated circuit (IC) structure 100 is shown. IC structure 100 may include a substrate 102 (FIGS. 4A-4B) having a plurality of fins 110 formed therefrom. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Fins 110 may be formed from substrate 102, e.g., by patterning and etching. Where substrate 102 includes a SOI substrate, fins 110 may be formed from the upper semiconductor layer over the insulator layer. As used herein "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches. While two fins 110 are shown, it is to be understood that any number of fins may be employed without departing from aspects of the disclosure.

IC structure 100 may also include an isolation region 114 (FIGS. 4A-4B) over substrate 102 to separate device regions (not individually referenced). Isolation region 114 may include a shallow trench isolation (STI) which may be formed by etching a trench within substrate 102 and filling, e.g., by deposition, the trench with an insulator, e.g., silicon oxide, silicon nitride, silicon oxynitride. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

A plurality of dummy gate stacks 120 may be formed within IC structure 100, such that dummy gate stacks 120 are perpendicular to and overlap fins 110. Dummy gate stacks 120 may be formed by depositing and etching a dummy gate material, e.g., amorphous carbon, over IC structure 100 including fins 110 such that a dummy gate 122 remains. While not shown, the formation of dummy gate 122 may be preceded by the formation of a gate dielectric material as known in the art. After dummy gates 122 are formed, a spacer material may be deposited over IC structure 100 including fins 110 and etched such that spacers 124 remain on opposing sides of dummy gates 122. As known in the art, standard processing may continue to form, e.g., source and drain regions (not individually shown). Source and drain regions may be formed within, on, and/or surrounding portions of fins 110 not covered by dummy gate stacks 120 by deposition, doping, and/or epitaxial growth. While four dummy gate stacks 120 are shown, it is to be understood that any number of dummy gate stacks may be employed without departing from aspects of the disclosure.

Subsequently, an interlayer dielectric (ILD) 126 may be formed over fins 110 (including source and drain regions) and dummy gate stacks 120, and planarized to a top surface of dummy gate stacks 120 such that a top surface of dummy gate stacks 120 are exposed. ILD 126 may include, for example, silicon oxide, silicon nitride, silicon oxynitride, and is thus shown with the same cross-hatching as isolation region 114. However, it is to be understood that any conventional ILD material known in the art can be used for ILD 126 without departing from aspects of the disclosure. For example, other ILD materials may include: fluorinated $SiO_2$ (FSG), hydrogenated silicon oxycarbide (SiCOH), porous SiCOH, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 2:
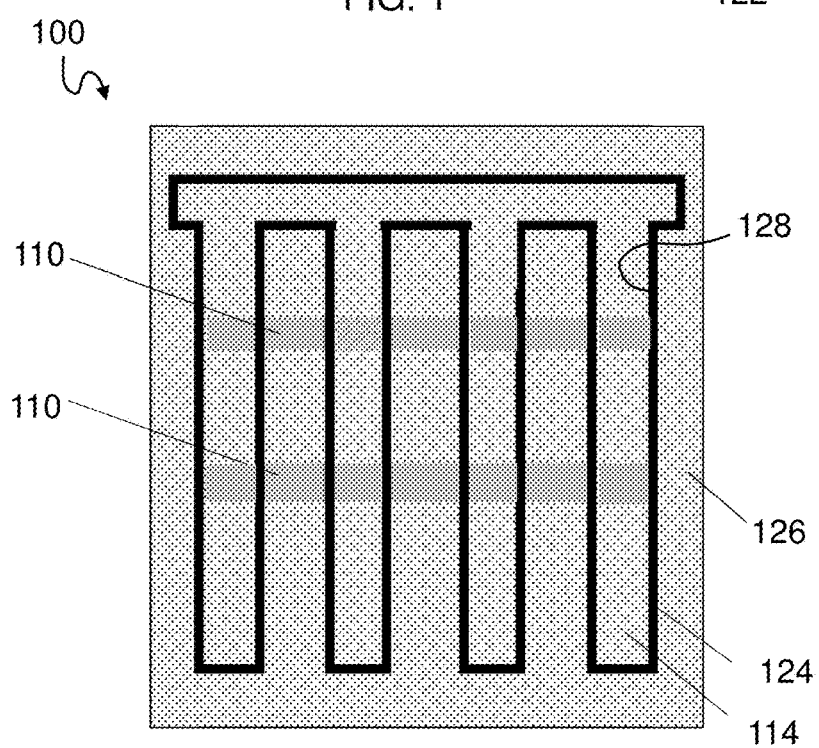
Figure 3:
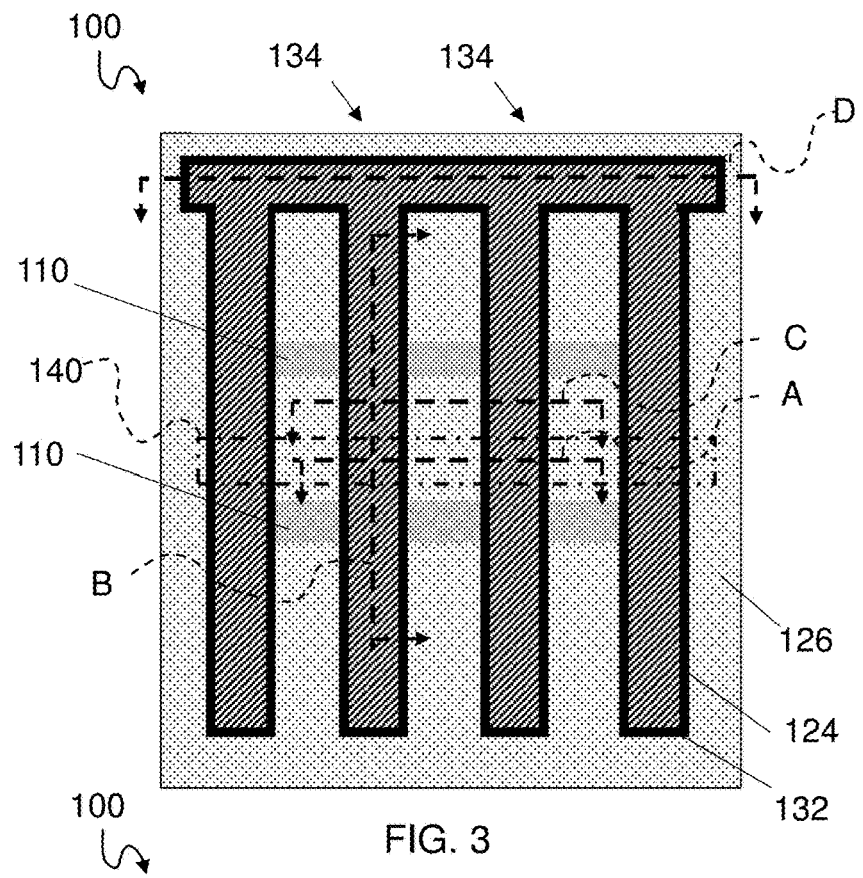

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii)

low-viscosity liquid epoxies; (ix) spin-on glass (SOG) materials; and/or (x) sacrificial etch-back As shown in FIG. 2, dummy gates 122 may be removed from dummy gate stacks 120 (e.g., from between spacers 124) such that an openings 128 are created between spacers 124. As shown, openings 128 may expose fins 110 (or the gate dielectric layer (not shown)) and isolation regions. Openings 128 (FIG. 2) may be filled, e.g., by deposition, with a metal 132 such that a replacement metal gate 134 is formed within ILD 126 as shown in FIG. 3. Metal 132 may be planarized to a top surface of ILD 126. Metal 132 may include, for example, at least one of: titanium, titanium nitride, tungsten, tungsten nitride, copper, copper nitride, tantalum, tantalum nitride, alloys or combinations thereof. While not shown, it is to be understood that metal gates 134 may also include other conventional active gate stack layers beneath metal 132, such as for example, a layer having a high dielectric constant (high-k layer), barrier layers, wetting layers, and work function metal layers. High-k layers may include, for example, at least one of: hafnium oxide, hafnium silicate, nitride hafnium silicate, zirconium oxide, zirconium silicate, titanium oxide, lanthanum oxide, yttrium oxide, aluminum oxide, or combinations thereof. Barrier and/or wetting layers may include, for example, titanium nitride. Work function metal layers may each act as a doping source, and a different work function setting metal can then be employed depending on whether a n-type field-effect-transistor (NFET) or a p-type field-effect-transistor (PFET) device is desired. Thus, the same gate conductor (metal 132) can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. In such embodiments, metal 132 may be formed over the work function metal layer.

Figure 4A:
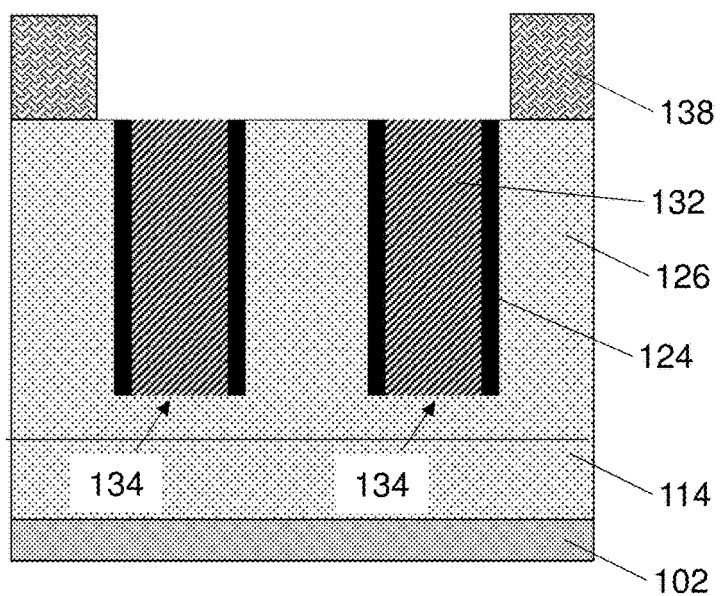
FIGS. 4A, 5A, 6A, 7A, 8A, and 9A show cross-sectional views taken along line A-A of the integrated circuit structure of FIG. 3 being processed in a method according to aspects of the disclosure.
Figure 4B:
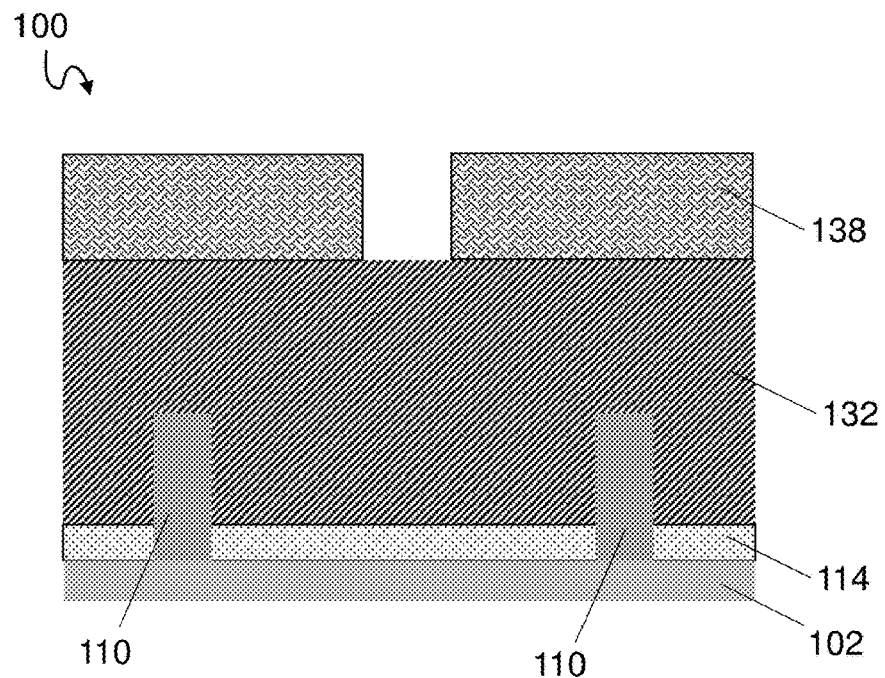
FIGS. 4B, 5B, 6B, 7B, 8B, and 9B show cross-sectional views taken along line B-B of the integrated circuit structure of FIG. 3 being processed in a method according to aspects of the disclosure.

Turning now to FIGS. 4A-4B, a mask 138 may be formed, e.g., by deposition, over IC structure 100. FIG. 4A shows a cross-sectional view of FIG. 3 taken along line A-A. FIG. 4B shows a cross-sectional view of FIG. 3 taken along line B-B. As known in the art, a "mask" is a material or stack of materials which may be formed over an underlying material which is to be processed. The mask may be patterned to have openings such that the underlying material is exposed. Subsequently, the underlying material may be processed where the underlying material is exposed by the openings in the mask. Once the underlying material is processed, the mask may be removed. Conventional masking materials include photoresist and nitride. As shown, mask 138 may be patterned to expose portions of metal gates 134 where it is desired to form an insulator therein.

Figure 5A:
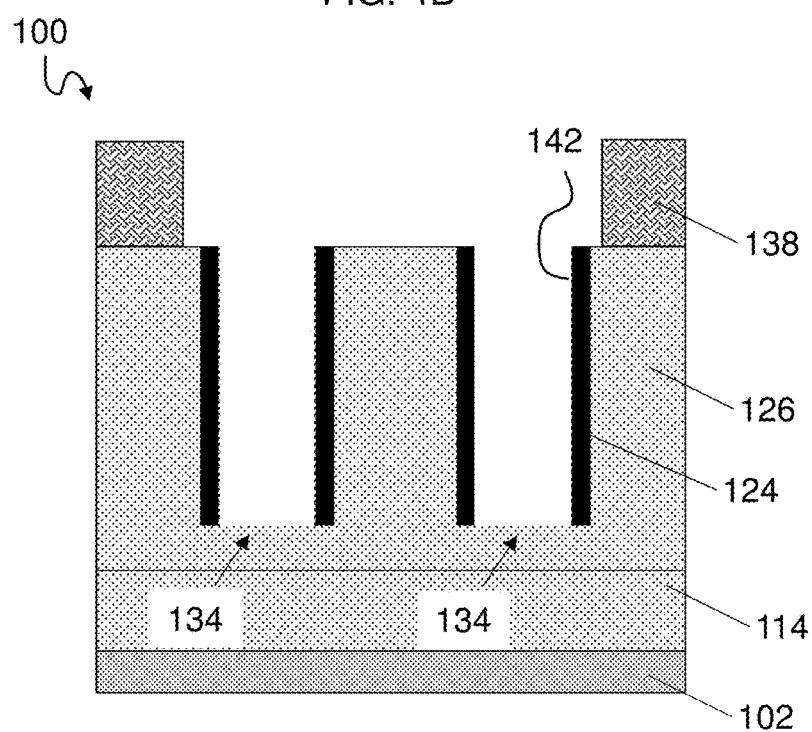
Figure 5B:
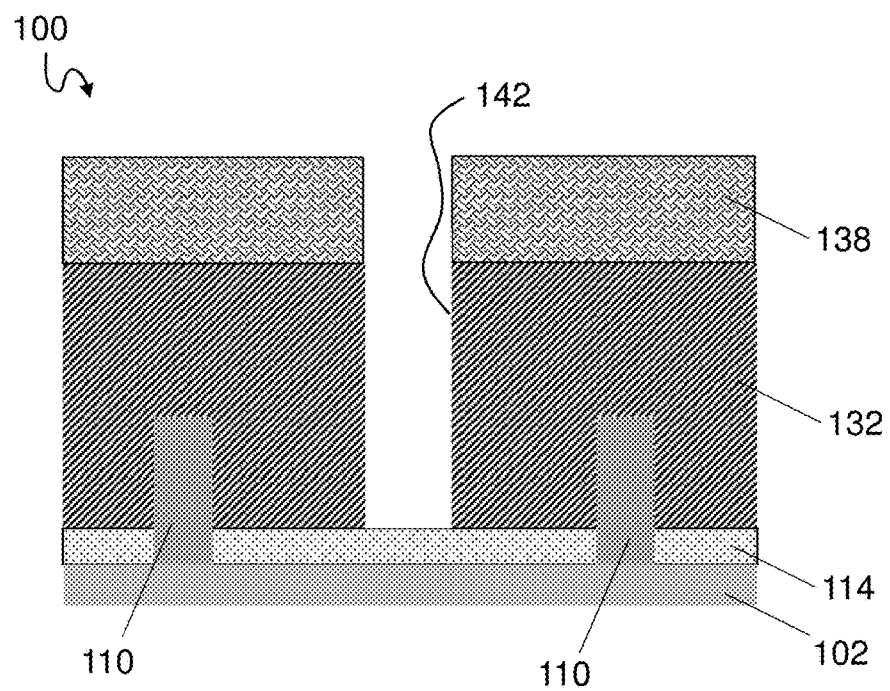

As shown in FIGS. 5A-5B, an opening 142 may be formed, e.g., by etching, within the portions of metal gates 134 which are exposed by mask 138. For example, referring briefly to FIG. 3, portions of metal 132 of metal gates 134 within dotted line box 140 may be exposed. These exposed portions of metal 132 within box 140 may be removed to create a line cut, i.e., a separation of metal 132 within metal gate 134 "lines", which may be filled with an insulator to divide and isolate portions of metal 132 within metal gates 134. It is to be understood, however, that the present disclosure is not so limited, and any desired portion of metal 132 may be removed from metal gates 134 for the formation of the insulator by customizing the patterning of mask 138.

Figure 6A:
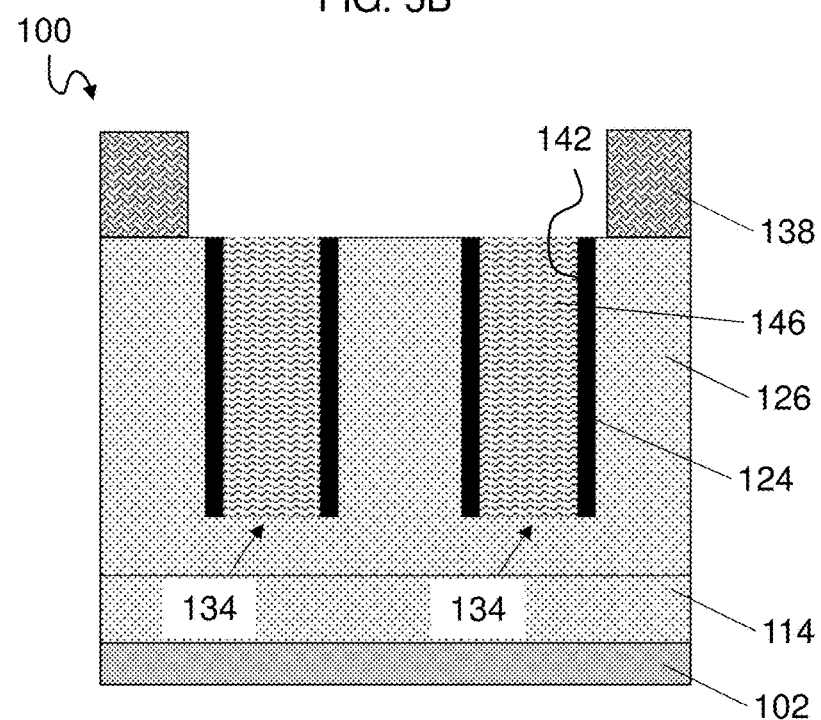
Figure 6B:
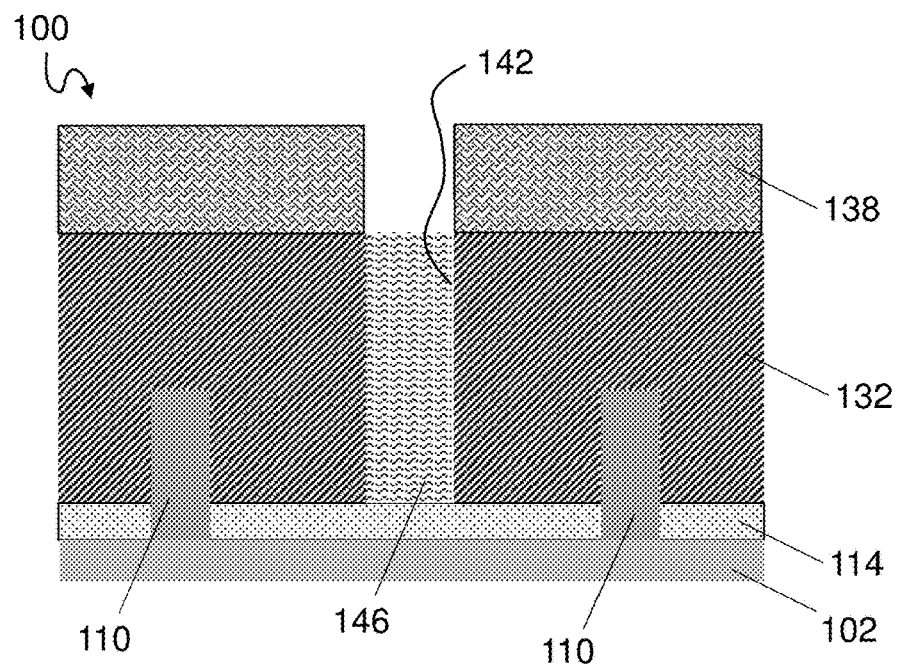
Figure 7A:
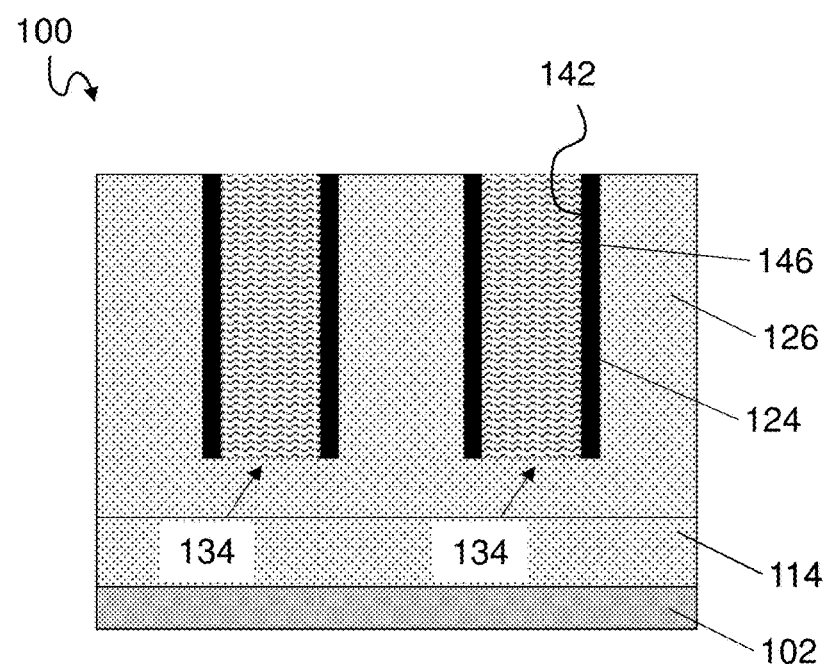
Figure 7B:
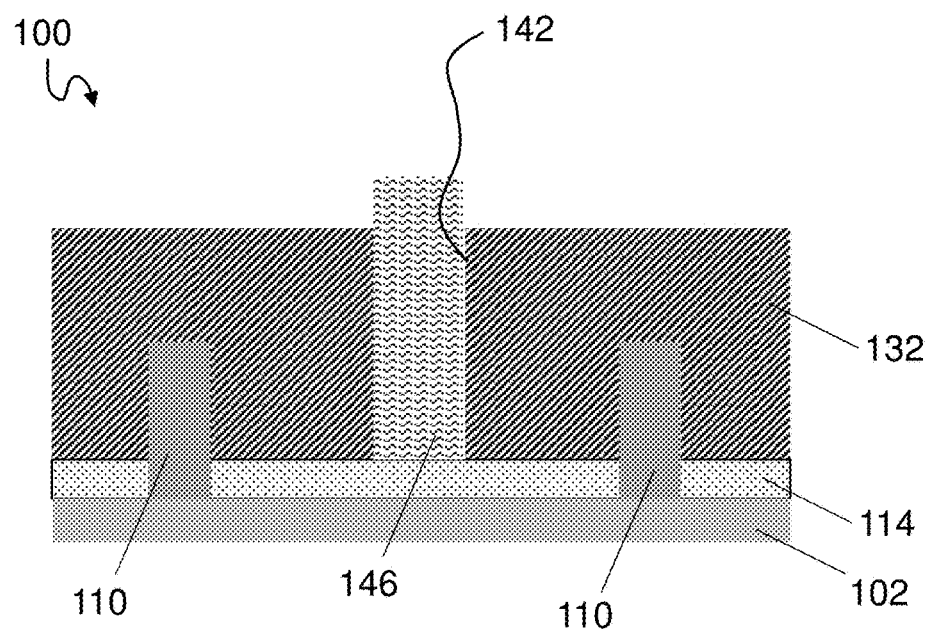
Figure 7C:
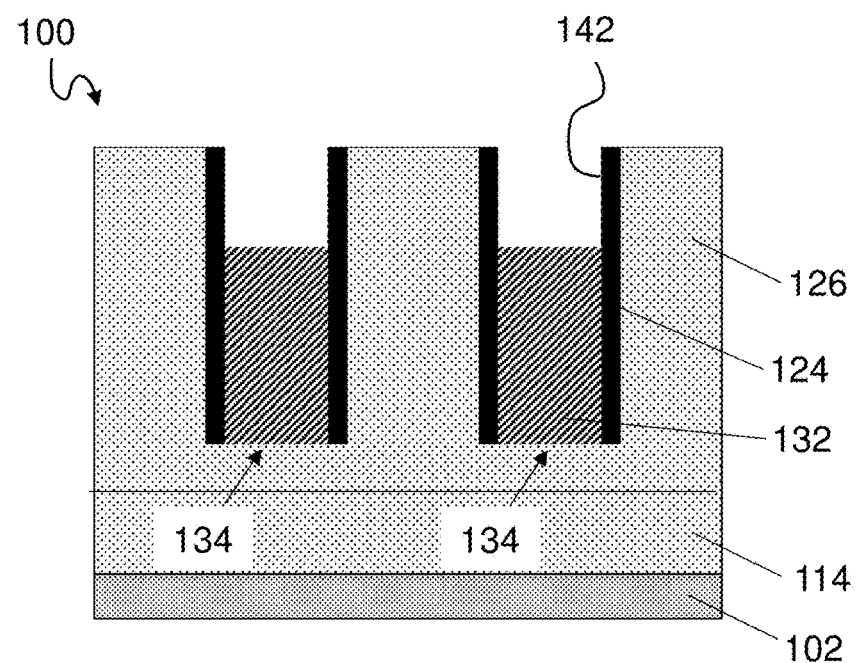
FIGS. 7C, 8C, and 9C show cross-sectional views taken along line C-C of the integrated circuit structure of FIG. 3 being processed in a method according to aspects of the disclosure.
Figure 8A:
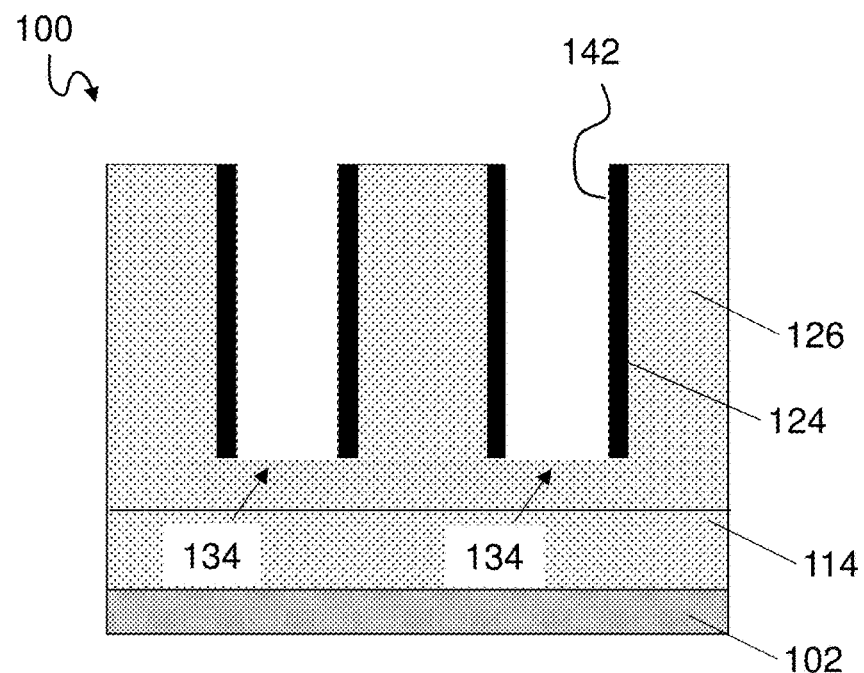
Figure 8B:
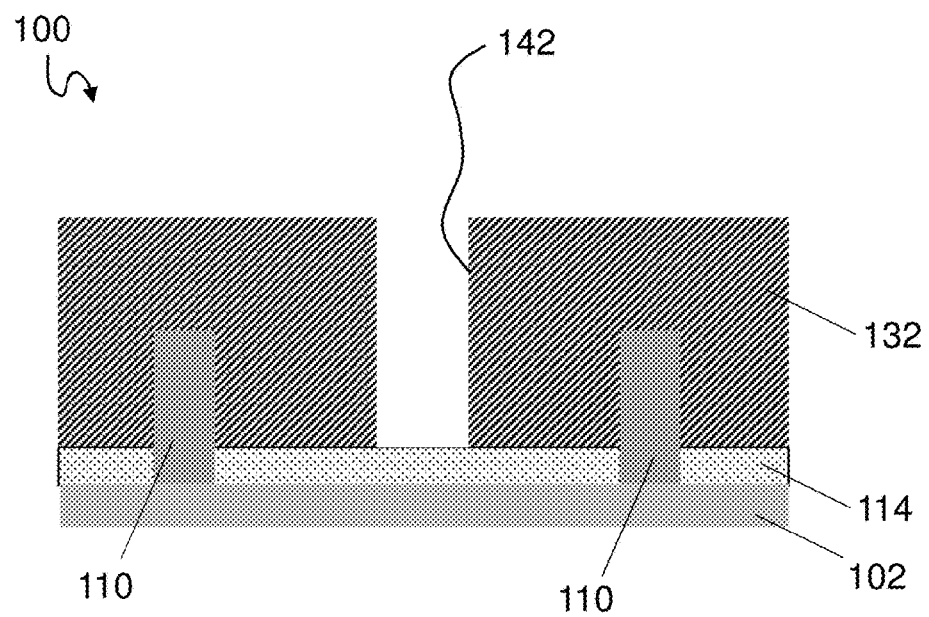
Figure 8C:
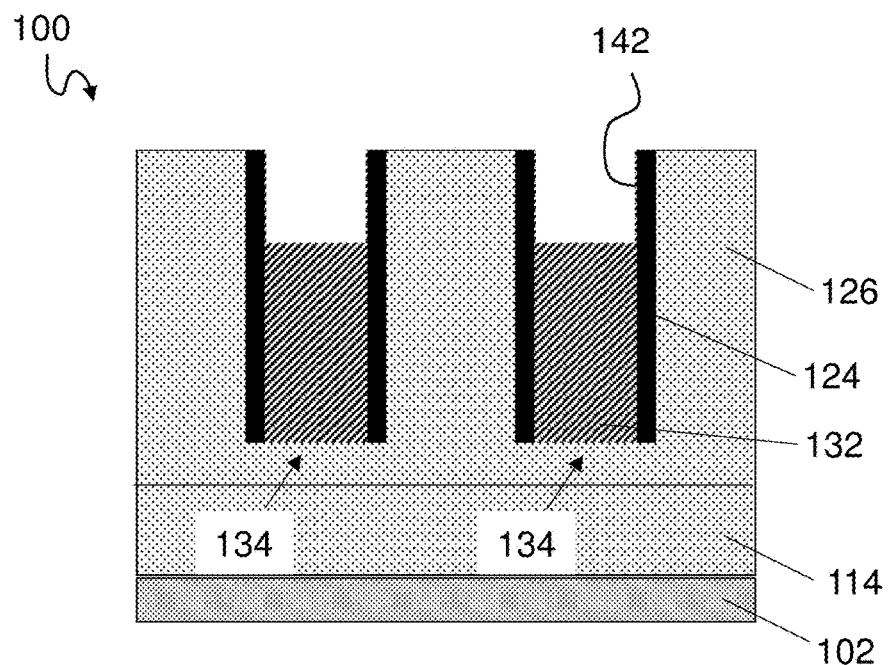

Turning now to FIGS. 6A-6B, openings 142 may be filled, e.g., by deposition, with another mask 146. Mask 146 may include any now known or later developed spin-on-hardmask (SOH) material, e.g., spin-on amorphous carbon or spin-on organic planarizing material. After, mask 146 is formed, mask 138 (FIGS. 6A-6B) may be removed from IC structure 100 to expose ILD 126 and portions of metal gates 134 thereunder as shown in FIGS. 7A-7C. Further, metal gate 134 may be recessed such that a height of metal gate 134 is reduced and is less than a height of mask 146. After, metal gate 134 is recessed, mask 146 (FIG. 7A-7B) may be removed from opening 142 as shown in FIGS. 8A-8C.

Figure 9A:
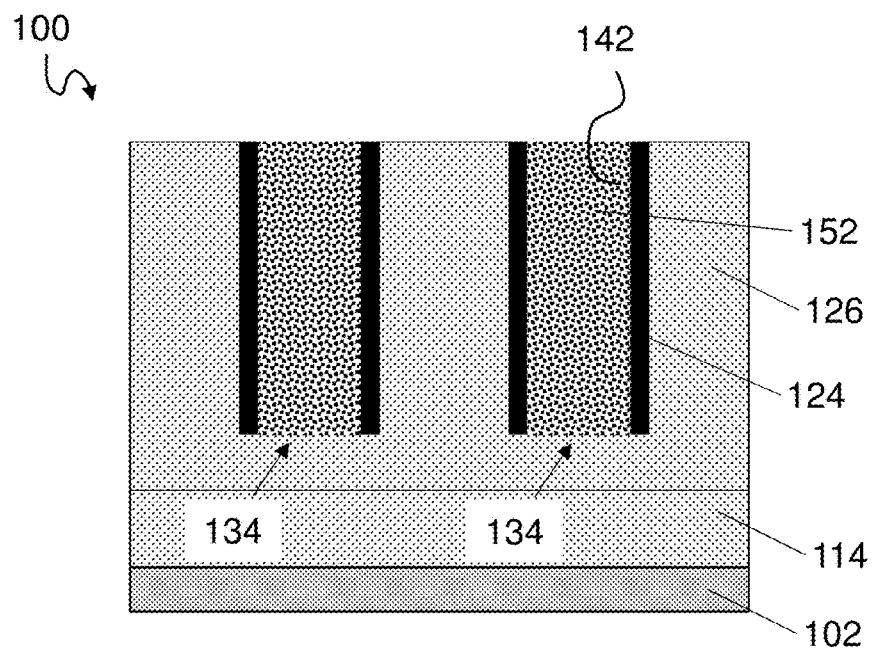
Figure 9B:
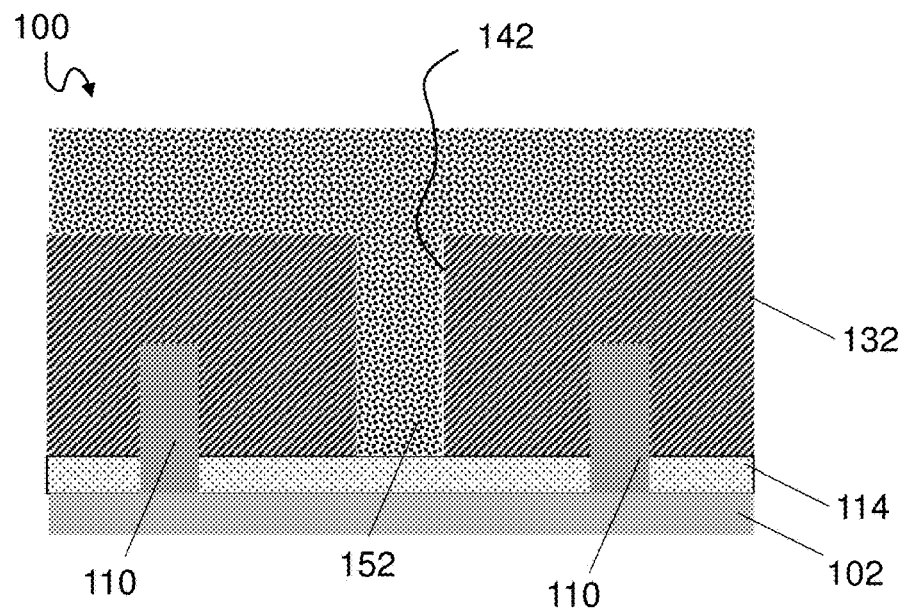
Figure 9C:
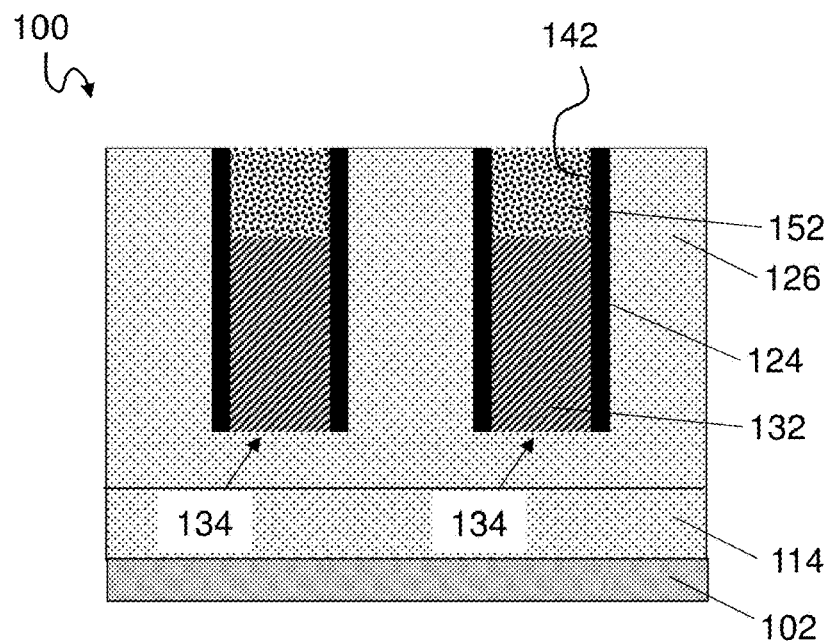
Figure 9D:
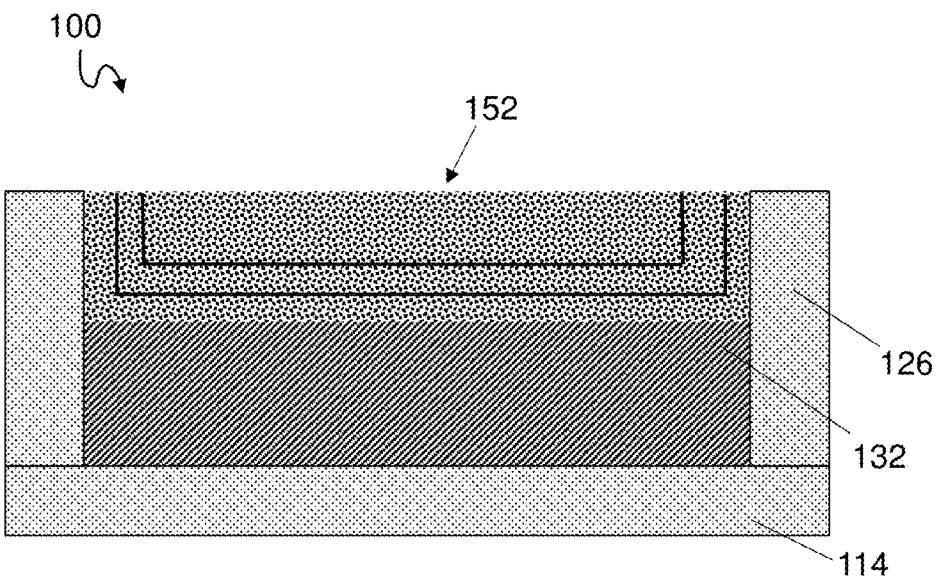
FIG. 9D shows a cross-sectional view taken along line D-D of the integrated circuit structure of FIG. 3 being processed in a method according to aspects of the disclosure.

As shown in FIGS. 9A-9C, an insulator 152 may be formed, e.g., by deposition, over the recessed metal gate 134 and fill opening 142 to isolate a portion of metal gate 134 from another portion of metal gate 134. Insulator 152 may include any now known or conventional insulating or dielectric materials used for isolating or dividing portions of metal gate 134, e.g., silicon oxide, or silicon nitride. In some embodiments, insulator 152 may include a stack of insulator materials (not individually shown) such that forming insulator 152 may include forming a stack of insulator materials. The forming of the stack of insulator materials may include atomic layer depositing a silicon nitride layer, depositing another layer of silicon nitride by a high quality or high performance ALD such as Olympia™ ALD by Applied Materials, and depositing another layer of silicon nitride by a high-density plasma (HDP) CVD. FIG. 9D shows IC structure 100 a cross-sectional view taken along line D-D of FIG. 3 after insulator 152 has been formed and wherein insulator 152 includes the stack of insulator layers, i.e., which may be formed by atomic layer depositing a silicon nitride layer, depositing another layer of silicon nitride by a high quality or high performance ALD such as Olympia™ ALD by Applied Materials, and depositing another layer of silicon nitride by a high-density plasma (HDP) CVD.

The forming of insulator 152 includes simultaneously forming insulator 152 over the recessed metal gate 134 and filling opening 142. As a result, insulator 152 acts not only as an isolation plug within metal gate 134 but also as a gate cap layer over metal gate 134. Insulator 152 may be planarized to a top surface of ILD layer 126 such that planarizing insulator 152 includes simultaneously planarizing insulator 152 that is over the recessed metal gate 134 and insulator 152 that fills opening 142 within the recessed metal gate 134. In this way, aspects of the disclosure provide for a method of forming an IC structure 100 having insulator 152 within metal gate 134 that is more cost effective and efficient than conventional methods of forming the same.

Figure 10A:
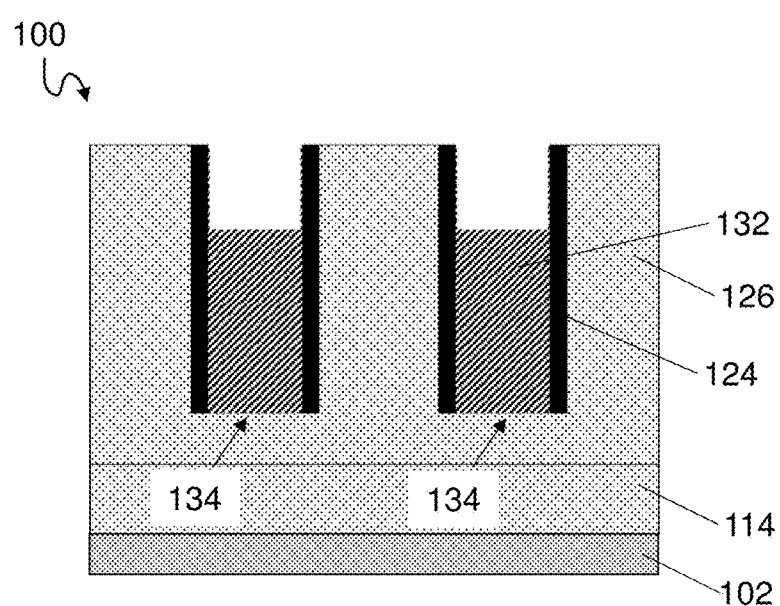
FIGS. 10A, 11A, 12A, and 13A show cross-sectional views taken along line A-A of the integrated circuit structure of FIG. 3 being processed in a method according to further aspects of the disclosure.
Figure 10B:
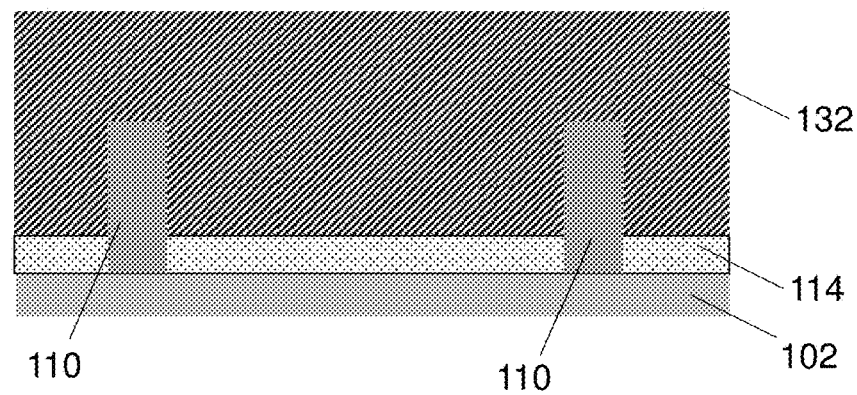
FIGS. 10B, 11B, 12B, and 13B show cross-sectional views taken along line B-B of the integrated circuit structure of FIG. 3 being processed in a method according to further aspects of the disclosure.
Figure 10C:
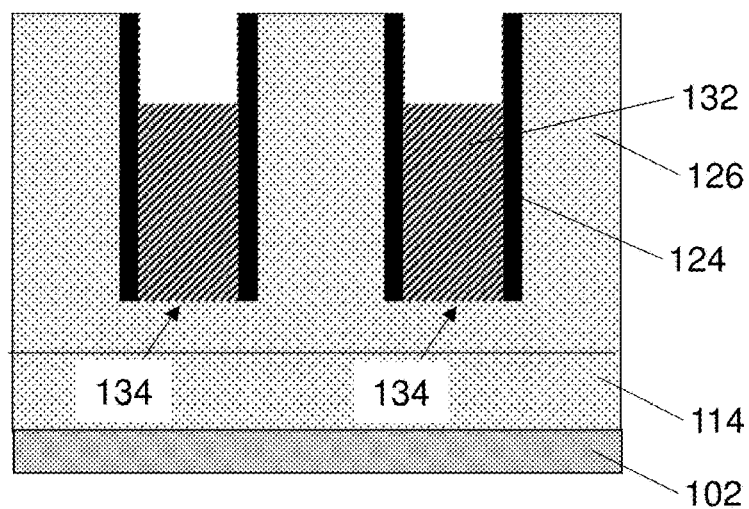
FIGS. 10C, 11C, 12C, and 13C show cross-sectional views taken along line C-C of the integrated circuit structure of FIG. 3 being processed in a method according to further aspects of the disclosure.

FIGS. 10A-13D show another embodiment of the disclosure. In this embodiment, after metal 132 of metal gates 134 is formed, metal 132 may be recessed, e.g., by etching, such that a height of metal 132 is less than a height of ILD 126 as shown in FIGS. 10A-10C. That is, in this embodiment, the recessing of metal gate 134 is performed prior to forming an opening, e.g., opening 208 (FIGS. 11A-11C). After metal 132 is recessed, a mask 202 may be formed, e.g., by deposition, over IC structure 100 and patterned to expose portions of metal gates 134 where it is desired to form an insulator therein as discussed relative to FIGS. 4A-4B.

Figure 11A:
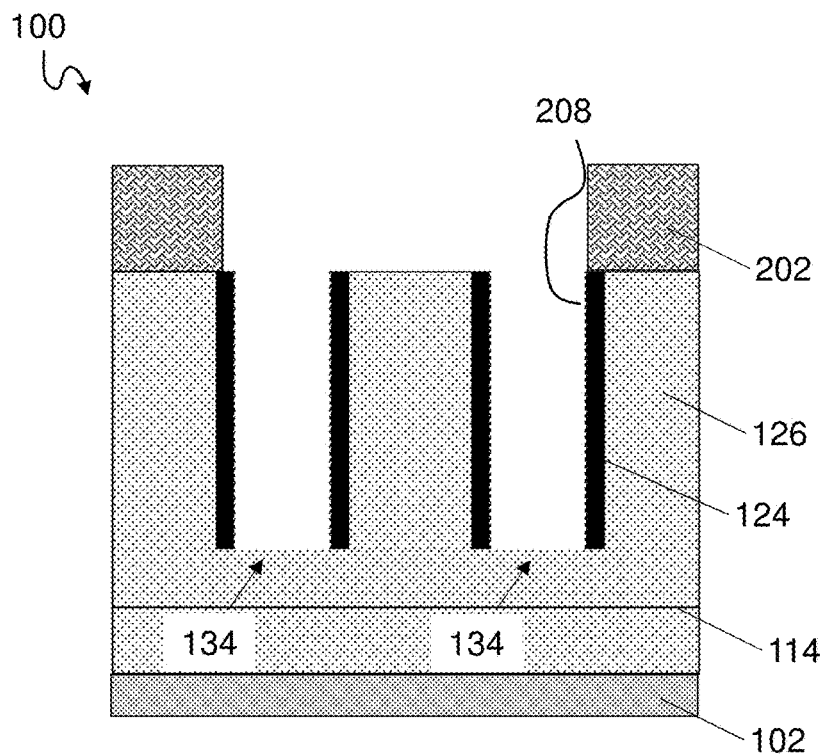
Figure 11B:
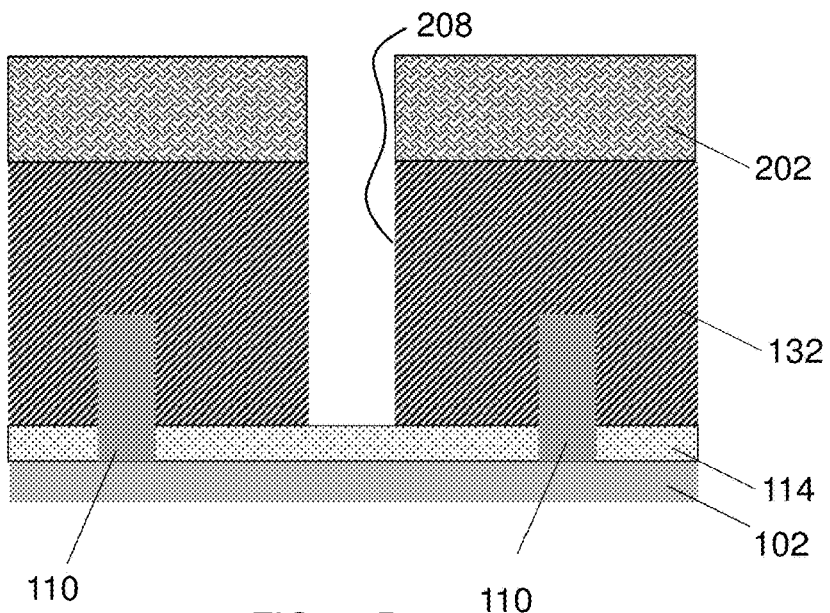
Figure 11C:
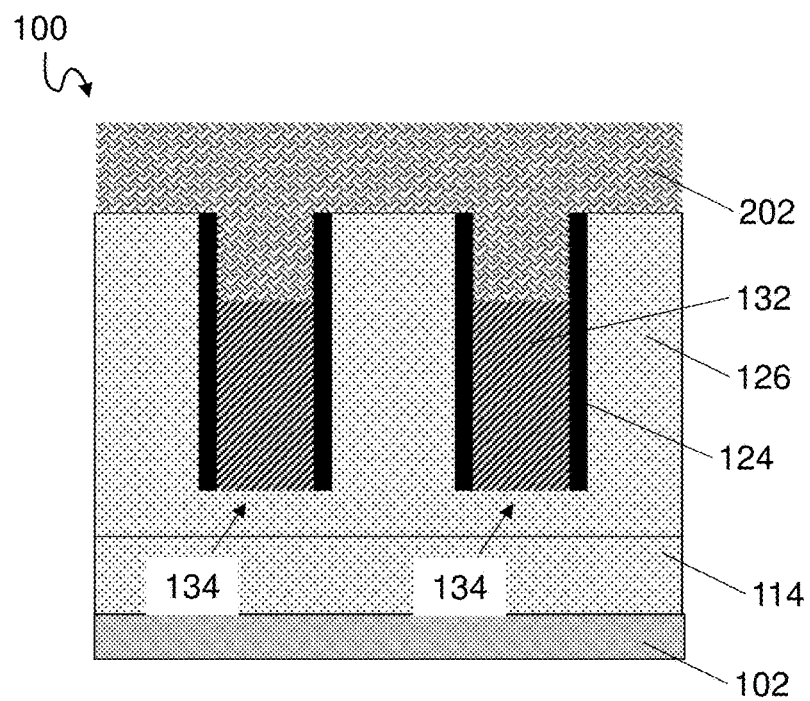

As shown in FIGS. 11A-11C, an opening 208 may be formed, e.g., by etching, within the portions of the recessed metal gates 134 which are exposed by mask 202. For example, referring briefly to FIG. 3, portions of metal 132 of metal gates 134 within dotted line box 140 may be exposed. These exposed portions of metal 132 within box 140 may be removed to create a line cut, i.e., a separation of metal 132 within metal gate 134 "lines", which may be filled with an insulator to divide and isolate portions of metal 132 within metal gate stacks 134. It is to be understood, however, that the present disclosure is not so limited, and any desired portion of metal 132 may be removed from metal gates 134 for the formation of the insulator by customizing the patterning of mask 202.

Figure 12A:
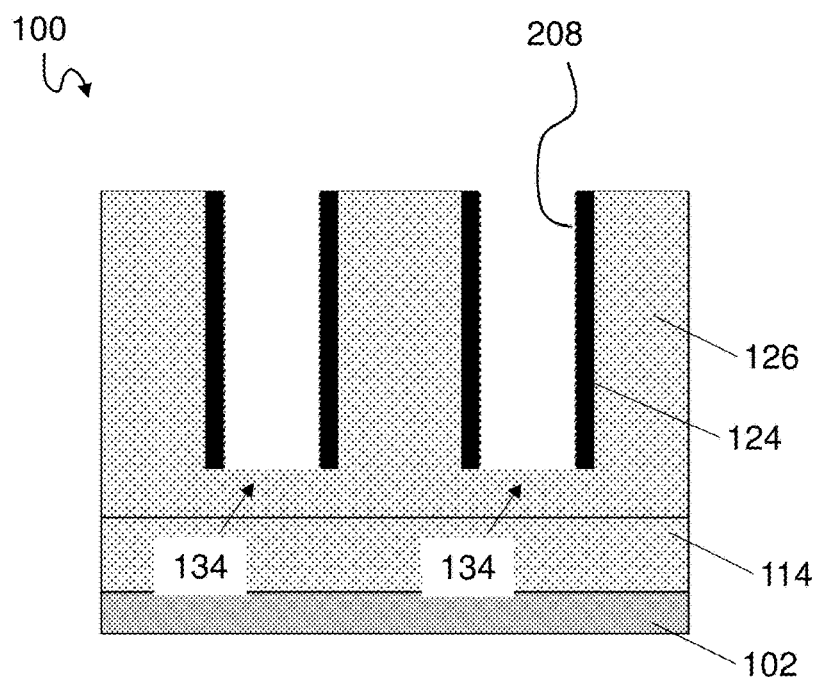
Figure 12B:
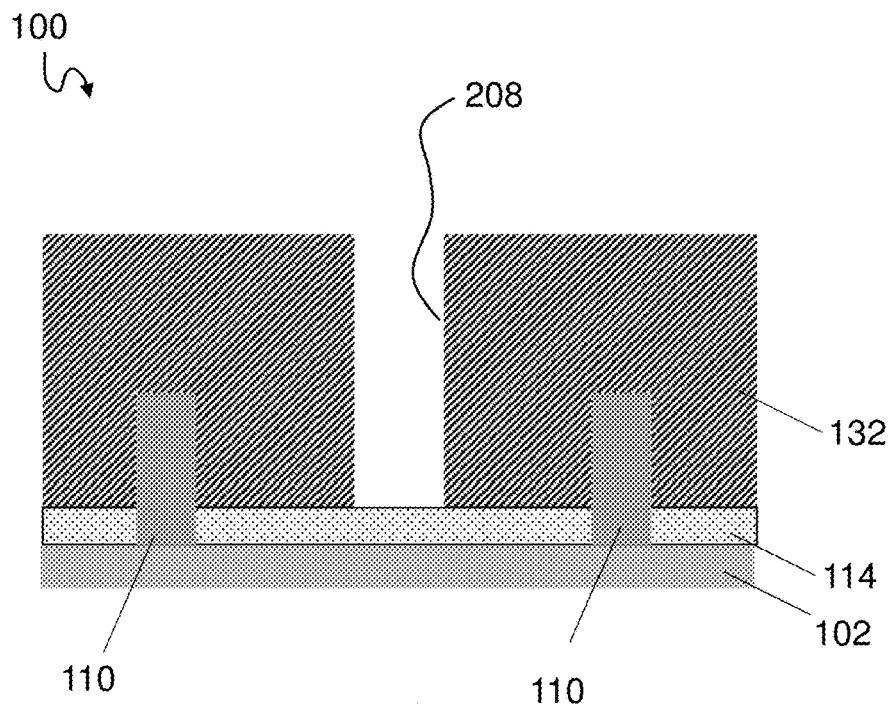
Figure 12C:
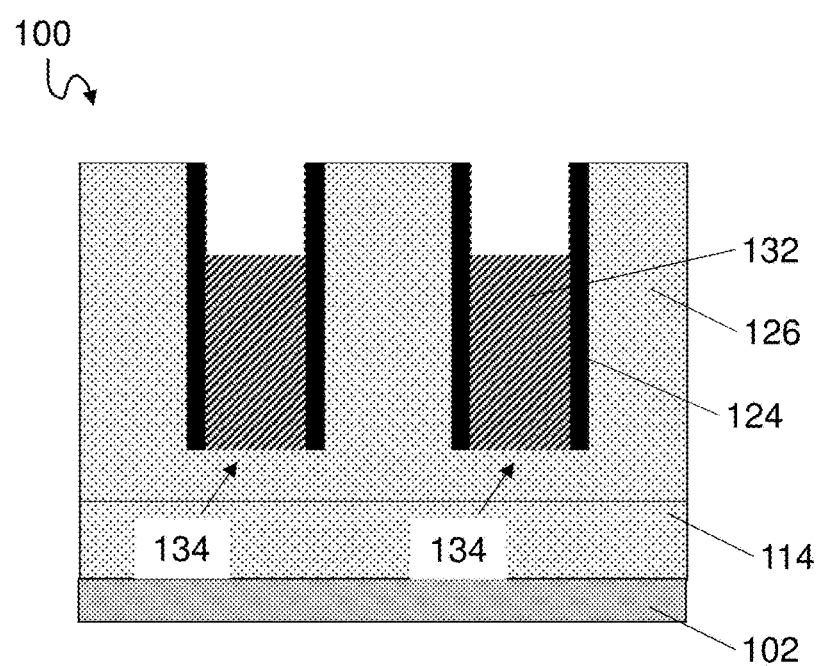
Figure 13A:
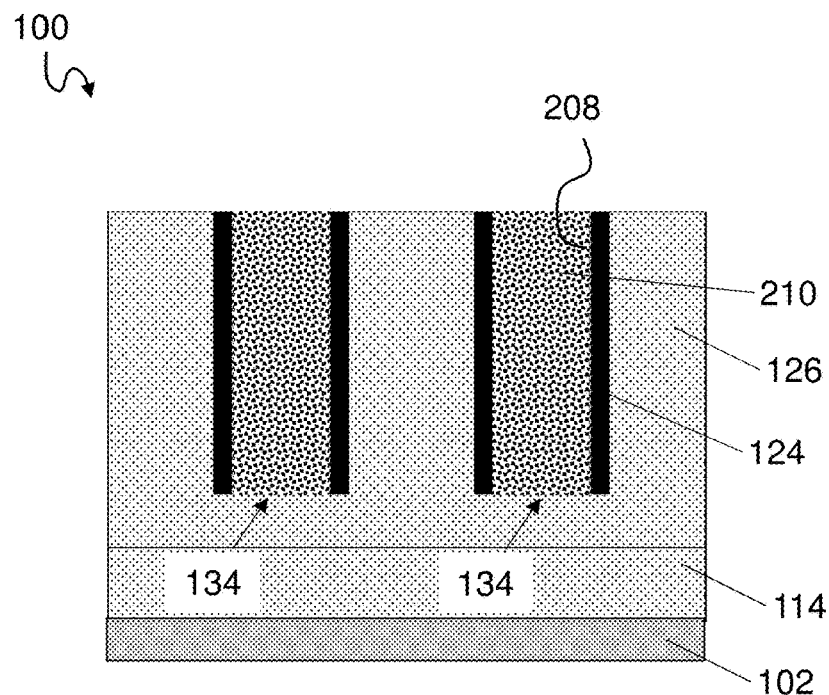
Figure 13B:
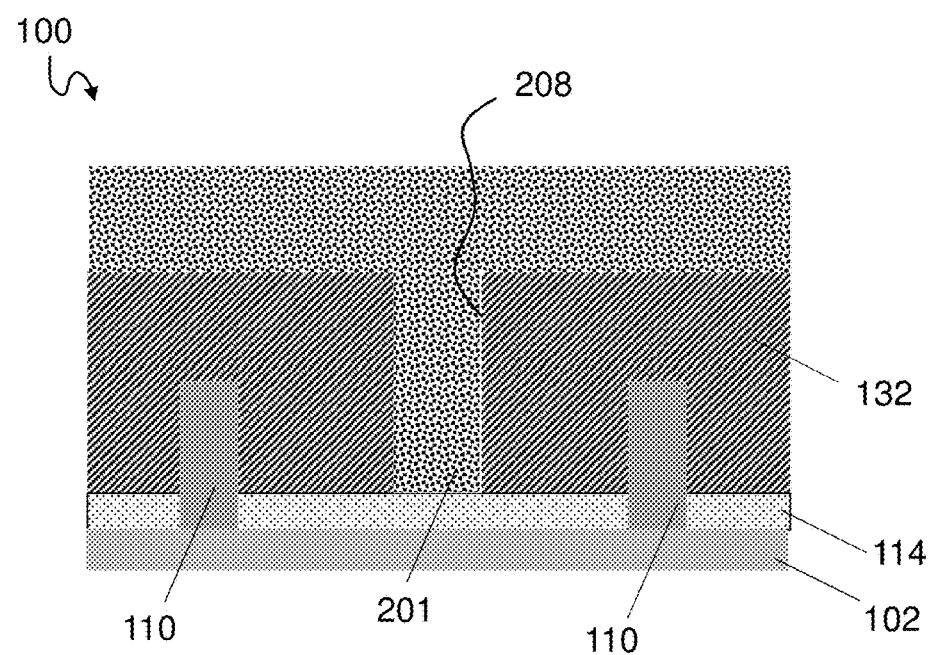
Figure 13C:
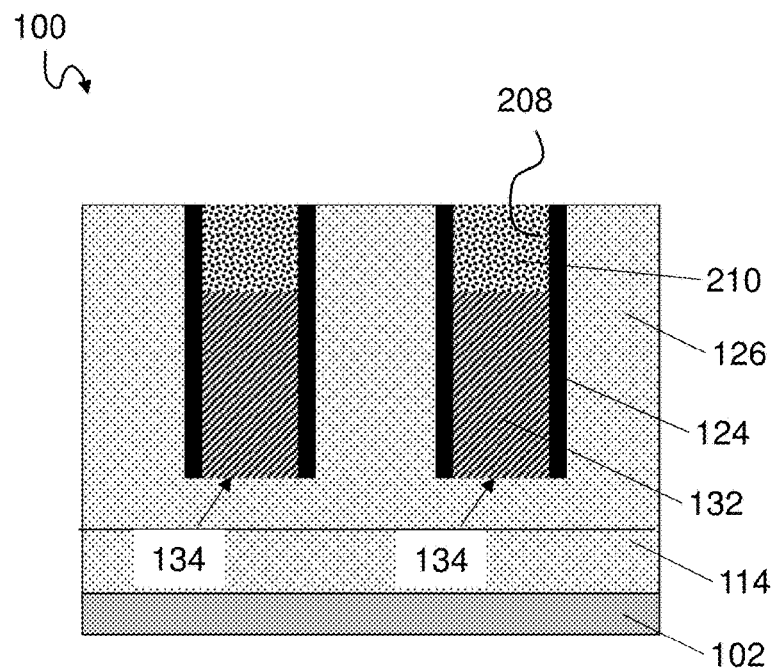
Figure 13D:
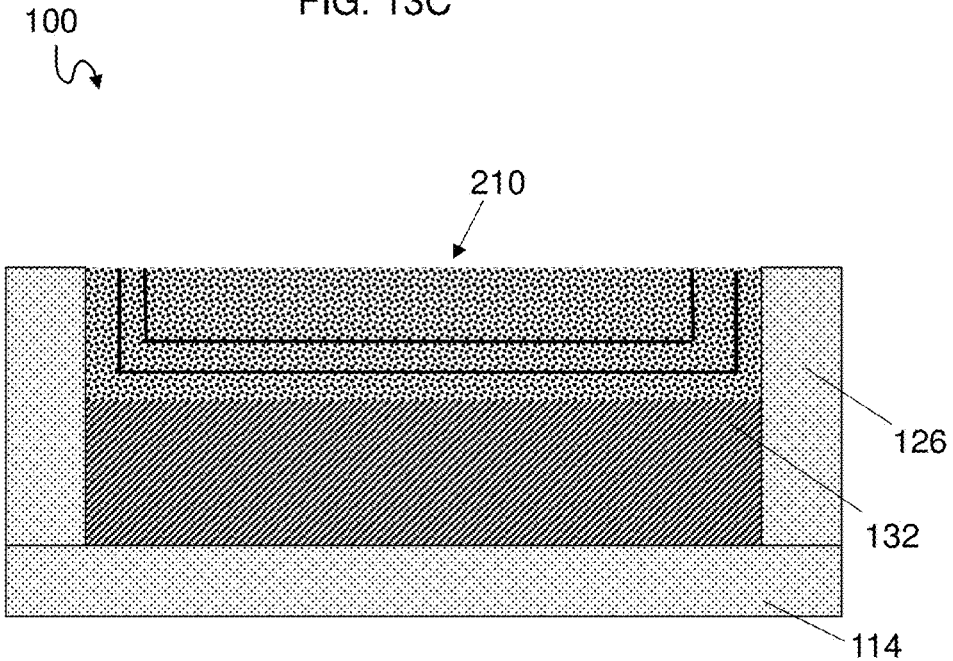
FIG. 13D shows a cross-sectional view taken along line D-D of the integrated circuit structure of FIG. 3 being processed in a method according to aspects of the disclosure.

Turning now to FIGS. 12A-12C, mask 202 (FIGS. 11A-11C) may be removed to expose metal 132 of metal gate 134 and ILD 126 thereunder. As shown in FIGS. 13A-13C, openings 208 may be filled with insulator 210 as described with respect to FIGS. 9A-9C. Insulator 210 may include may include any now known or conventional insulating or dielectric materials used for isolating or dividing portions of metal gate 134, e.g., silicon oxide, or silicon nitride. In some embodiments, insulator 210 may include a stack of insulator materials (not individually shown) such that forming insulator 210 may include forming a stack of insulator materials. The forming of the stack of insulator materials may include atomic layer depositing a silicon nitride layer, depositing another layer of silicon nitride by a high quality or high performance ALD such as Olympia™ ALD by Applied Materials, and depositing another layer of silicon nitride by a high-density plasma (HDP) CVD. FIG. 13D shows a cross-sectional view of IC structure 100 taken along line D-D of FIG. 3 after insulator 210 has been formed and wherein insulator 210 includes the stack of insulator layers, i.e., which may be formed by atomic layer depositing a silicon nitride layer, depositing another layer of silicon nitride by a high quality or high performance ALD such as Olympia™ ALD by Applied Materials, and depositing another layer of silicon nitride by a high-density plasma (HDP) CVD.

The forming of insulator 210 includes simultaneously forming insulator 210 over the recessed metal gate 134 and filling opening 208. As a result, insulator 210 acts not only as an isolation plug within metal gate 134 but also as a gate cap layer over metal gates 134. Insulator 210 may be planarized to a top surface of ILD layer 126 such that planarizing insulator 210 includes simultaneously planarizing insulator 210 that is over the recessed metal gate 134 and insulator 210 that fills opening 208 within the recessed metal gate 134. In this way, aspects of the disclosure provide for a method of forming an IC structure 100 having an insulator 210 within metal gate 134 that is more cost effective and efficient than conventional methods of forming the same.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit structure, the method comprising:
   forming a metal gate within a dielectric layer over a substrate;
   forming an opening within the metal gate;
   filling the opening with a mask;
   recessing the metal gate such that a height of the metal gate is reduced;
   removing the mask from the opening;
   forming an insulator over the recessed metal gate and filling the opening with the insulator; and
   planarizing the insulator to a top surface of the dielectric layer.

2. The method of claim 1, wherein the recessing of the metal gate is performed prior to the forming of the opening, and wherein the opening is formed within the recessed metal gate.

3. The method of claim 1, wherein the recessing of the metal gate includes recessing the metal gate to a height that is less than a height of the mask.

4. The method of claim 1, wherein the insulator isolates one portion of the metal gate from another portion of the metal gate.

5. The method of claim 1, wherein the forming of the insulator includes simultaneously forming the insulator over the recessed metal gate and filling the opening with the insulator.

6. The method of claim 1, wherein the planarizing of the insulator includes simultaneously planarizing the insulator that is over the recessed metal gate and the insulator that is filling the opening.

7. The method of claim 1, wherein the forming of the insulator includes forming a stack of insulator materials.

8. The method of claim 7, wherein the forming of the stack of insulator materials includes:
depositing a first silicon nitride layer via atomic layer deposition (ALD);
depositing a second silicon nitride layer via ALD; and
depositing a third silicon nitride layer via high-density plasma (HDP) chemical vapor deposition (CVD).

9. A method of forming an integrated circuit structure, the method comprising:
removing a dummy gate from between a pair of spacers over a substrate within a dielectric layer;
forming a replacement metal gate between the pair of spacers over the substrate;
forming an opening within the replacement metal gate thereby exposing the substrate thereunder;
recessing the replacement metal gate such that a height of the replacement metal gate is reduced;
forming an insulator over the recessed replacement metal gate and filling the opening with the insulator; and
planarizing the insulator to a top surface of the dielectric layer.

10. The method of claim 9, wherein the recessing of the replacement metal gate is performed prior to the forming of the opening, and wherein the opening is formed within the recessed replacement metal gate.

11. The method of claim 9, wherein the insulator isolates one portion of the metal gate from another portion of the metal gate.

12. The method of claim 9, further comprising:
planarizing the replacement metal gate after the forming of the replacement metal gate and prior to the forming of the opening.

13. The method of claim 9, wherein the forming of the insulator includes simultaneously forming the insulator over the recessed metal gate and filling the opening with the insulator.

14. The method of claim 9, wherein the planarizing of the insulator includes simultaneously planarizing the insulator that is over the recessed metal gate and the insulator that is filling the opening.

15. The method of claim 9, wherein the forming of the replacement metal gate includes forming a metal layer over a work function metal layer.

16. The method of claim 9, further comprising:
after the forming of the opening and prior to the recessing of the replacement metal gate, filling the opening with a mask;
wherein the recessing of the replacement metal gate is performed after the filling of the opening with the mask, the recessing including recessing the replacement metal gate to a height that is less than a height of the mask.

17. The method of claim 16, further comprising:
after the recessing of the opening and prior to the forming of the insulator, removing the mask.

18. The method of claim 9, wherein the forming of the insulator includes forming a stack of insulator materials.

19. The method of claim 18, wherein the forming of the stack of insulator materials includes:
depositing a first silicon nitride layer via atomic layer deposition (ALD);
depositing a second silicon nitride layer via ALD; and
depositing a third silicon nitride layer via high-density plasma (HDP) chemical vapor deposition (CVD).

* * * * *